US011978492B2

(12) United States Patent
Chang et al.

(10) Patent No.: US 11,978,492 B2
(45) Date of Patent: *May 7, 2024

(54) POWER SUPPLY GENERATOR ASSIST

(71) Applicant: Taiwan Semiconductor Manufacturing Company, Ltd., Hsinchu (TW)

(72) Inventors: Yen-An Chang, Miaoli County (TW); Po-Hao Lee, Hsinchu (TW); Yi-Chun Shih, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/737,234

(22) Filed: May 5, 2022

(65) Prior Publication Data

US 2022/0262421 A1 Aug. 18, 2022

Related U.S. Application Data

(63) Continuation of application No. 17/081,116, filed on Oct. 27, 2020, now Pat. No. 11,355,173.

(60) Provisional application No. 62/955,105, filed on Dec. 30, 2019.

(51) Int. Cl.
*G11C 11/16* (2006.01)

(52) U.S. Cl.
CPC ...... *G11C 11/1697* (2013.01); *G11C 11/1659* (2013.01); *G11C 11/1675* (2013.01)

(58) Field of Classification Search
None
See application file for complete search history.

(56) References Cited

U.S. PATENT DOCUMENTS

| 5,303,190 | A | 4/1994 | Pelley, III |
| 5,337,284 | A | 8/1994 | Cordoba et al. |
| 5,446,697 | A | 8/1995 | Yoo et al. |
| 5,483,486 | A | 1/1996 | Javanifard et al. |
| 5,663,918 | A | 9/1997 | Javanifard et al. |
| 5,726,944 | A | 3/1998 | Pelley, III et al. |
| 5,943,263 | A | 8/1999 | Roohparvar |
| 6,052,022 | A | 4/2000 | Lee |
| 2002/0171470 | A1 | 11/2002 | Sim et al. |
| 2005/0073355 | A1* | 4/2005 | Sivero ............ H02M 3/07 327/536 |
| 2006/0044884 | A1* | 3/2006 | Chae ............ G11C 5/145 365/189.09 |
| 2006/0140018 | A1 | 6/2006 | Do |
| 2009/0273391 | A1* | 11/2009 | Tseng ............ G11C 16/30 327/536 |

(Continued)

*Primary Examiner* — J. H. Hur
(74) *Attorney, Agent, or Firm* — Merchant & Gould P.C.

(57) ABSTRACT

The disclosed system and method reduce on-chip power IR drop caused by large write current, to increase the write IO number or improve write throughput and to suppress write voltage ripple at the start and end of a write operation. The disclosed systems and methods are described in relation to stabilizing the bit line voltage for MRAMs, however, the disclosed systems and methods can be used to stabilize the bit line voltage of any memory configuration that draws large currents during short write pulses or, more generally, to selectively assist a power supply generator in supplying adequate power to a load at times of large power consumption.

20 Claims, 7 Drawing Sheets

(56) References Cited

U.S. PATENT DOCUMENTS

2011/0249490 A1* 10/2011 Zhu ........................ G11C 11/16
 365/171
2013/0285737 A1 10/2013 Lin et al.
2020/0161968 A1 5/2020 Lin

* cited by examiner

POWER SUPPLY GENERATOR ASSIST

CROSS-REFERENCE

This application is a continuation of U.S. application Ser. No. 17/081,116, filed Oct. 27, 2020, which claims the benefit of U.S. Provisional Application No. 62/995,105, filed on Dec. 30, 2019, which are incorporated by reference in their entirety.

BACKGROUND

In general, magnetoresistive Random Access Memory (MRAM) is a non-volatile memory (NVM) where data is stored in magnetic storage elements. In simple configurations, each cell has two ferromagnetic plates, each of which can hold a magnetic field, separated by a thin insulating layer. One of the plates is a permanent magnet set to a selected polarity and the other plate's field can be changed to match that of an external field to store a bit. Depending upon the field, the cell is either in the low ($R_L$) resistive state, which may represent a logic "0", or the high ($R_H$) resistive state, which may represent a logic "1."

One advantage of using MRAM as an alternative embedded NVM is the faster write speed when compared to eFlash memory. However, the short write pulse, combined with the high write current of the magnetic tunnel junction (MTJ) imposes a great challenge on the on-chip low-dropout regulator (LDO) in terms of the IR drop and settling time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
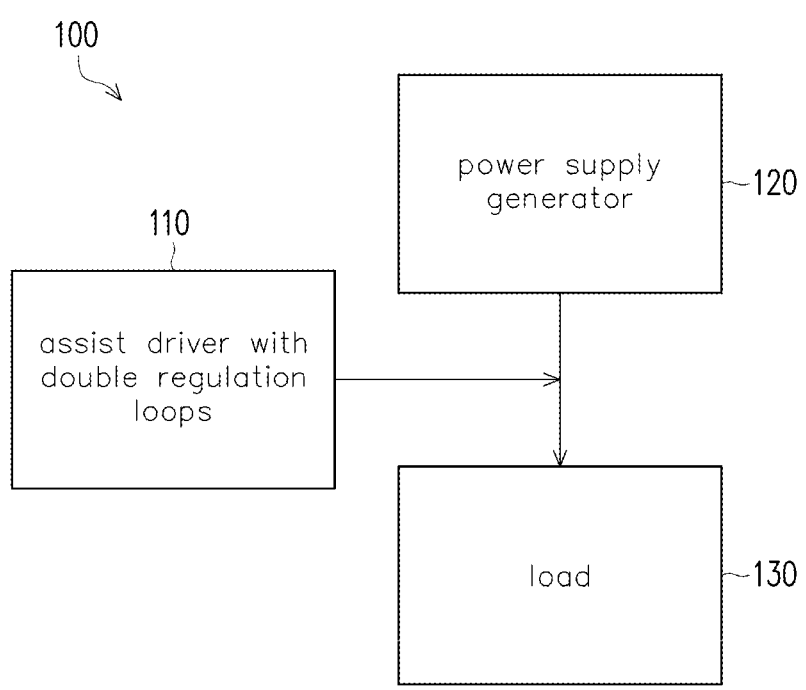
FIG. 1 is a block diagram illustrating an example of a voltage generator assist system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Driving a large current during short write pulses in a MRAM is a challenge for the write bias voltage generator. The write current may cause a large IR drop of the on-chip write bias voltage. It may also impact the write speed, write throughput and write performance.

Disclosed embodiments provide a system and method to reduce on-chip power IR drop caused by large write current, to increase the write IO number or improve write throughput and to suppress write voltage ripple at the start and end of a write operation. The disclosed systems and methods are described in relation to stabilizing the bit line voltage for MRAMs, however, the disclosed systems and methods can be used to stabilize the bit line voltage of any memory configuration that draws large currents during short write pulses or, more generally, to assist a power supply generator in supplying adequate power to a load at times of large power consumption.

FIG. 1 is a block diagram of voltage generator assist system 100. The voltage generator assist system includes a load 130 connected to power supply generator 120 and an assist driver with double regulation loops circuit 110, herein after voltage assist circuit 110. In some examples, the load 130 can typically be powered by the power supply generator 120. However, during periods when the load requires large power draw, the power supply generator 120 may not be able to fully meet the power demand form the load 130. In some examples, the voltage assist circuit 110 assists the power supply generator 120 in meeting the power demands of the load 130.

In some examples, the voltage assist circuit 110 goes into an active mode and assists the power supply generator 120 in meeting the power demands of the load 130 during periods when the power supply generator 120 cannot by itself meet the power demands of the load 130. In other examples, during periods when the power supply generator can meet the power demands of the load 130 without any assistance, the voltage assist circuit 110 goes into a standby mode and allows the power supply generator 120 to power the load without any assistance from the voltage assist circuit 110. The voltage assist circuit 110 is described in further detail in relation to FIG. 2-6.

In some examples, the power supply generator 120 can be an on-chip power supply generator that is located on the same chip as the load, or it can be an off-chip power supply generator. In some examples, the power supply generator 120 can be one or more low-drop-out regulators and/or one or more charge pump circuits.

The disclosed embodiments are described in relation to a load 130 that is a MRAM array. An example embodiment of an MRAM memory cell is show in FIG. 8. However, the load 130 can also include other types of memory arrays or even other types of integrated circuits that require periods of high power.

Figure 2:
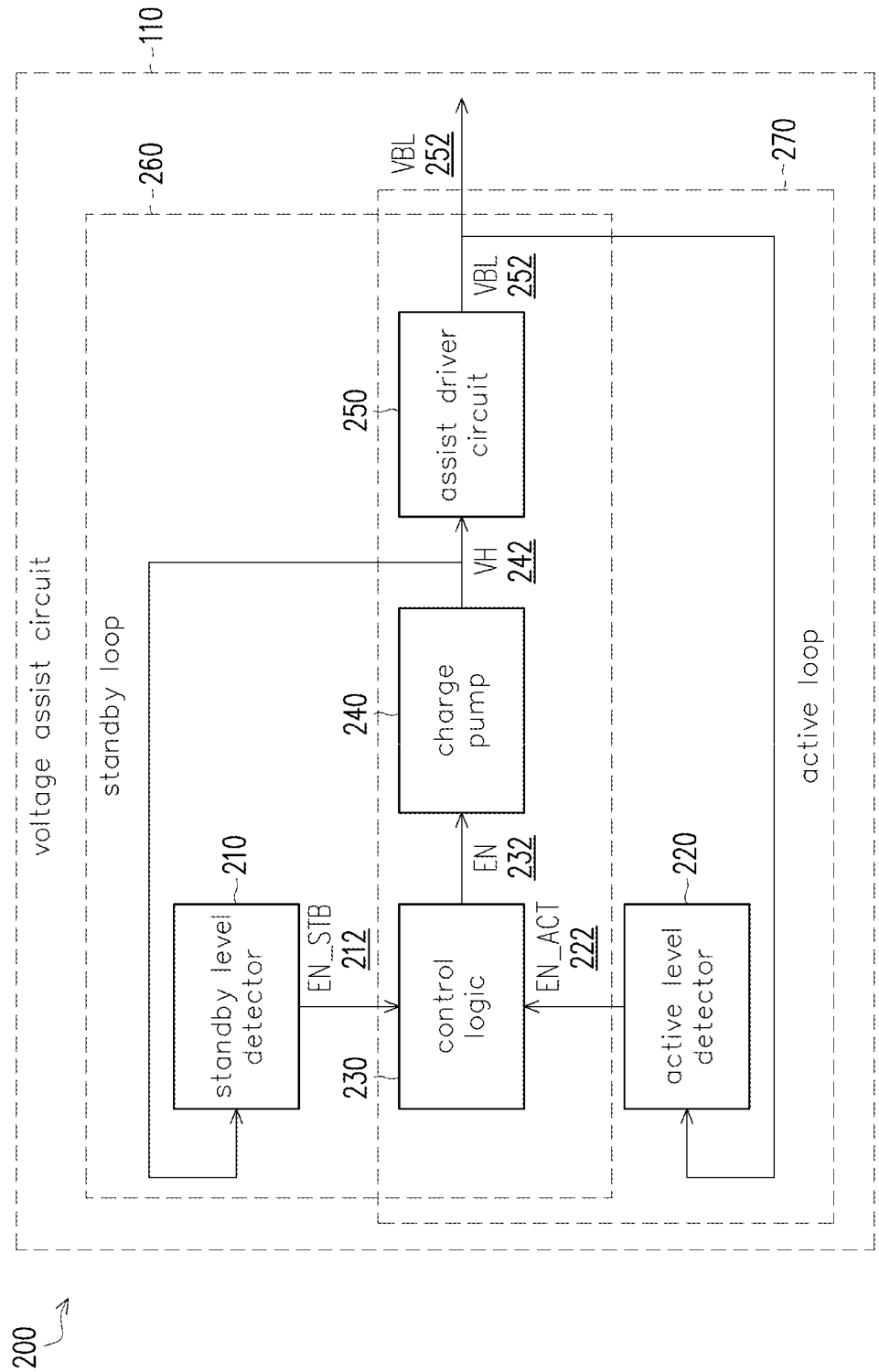
FIG. 2 is a block diagram illustrating an example of the assist driver of FIG. 1 with double regulation loops in accordance with some embodiments.

FIG. 2 is a block diagram 200 illustrating an example of the voltage assist circuit 110. In one example, the voltage assist circuit 110 includes a standby level detector 210 to detect when the voltage generator assist system 100 is in standby mode and an active level detector 220 to detect when the voltage generator assist system 100 is in active mode. The output of the standby level detector 210, referred to as the EN_STB signal 212 and the output of the active level detector 220, referred to as the EN_ACT signal 222, are both connected to control logic 230. The output of the control logic 230, referred to as the EN signal 232, is connected to a charge pump circuit 240. And the output of the charge pump circuit 240, referred to as the VH signal 242, is connected to an assist driver circuit 250.

In some examples, the input of the standby level detector 210 is connected to the VH signal 242 and the input of the active level detector 220 is connected to the output of the assist driver circuit 250, also referred to as the VBL 252. In some embodiments, when the load includes a memory array with one or more memory cells, the VBL 252 is the bit line power supply of the memory array. An example MRAM memory cell and the associated bit line and word lines are described in further detail in relation to FIG. 8. In some embodiments, the output of the assist driver circuit 250 can be connected to a switch that may control when the output voltage of the voltage assist circuit 110, VBL 252 can assist the power supply generator 120 in supplying power to the load 130.

In some examples, the voltage assist circuit 110 includes two regulation loops, the standby loop 260 and the active loop 270. In some examples, the target level of the VH signal 242 can be the sum of VBL 252 and the threshold voltage ($V_{threshold,N}$) of the assist driver circuit 250.

In some examples, when the voltage generator assist system 100 is in a standby state, the standby loop 260 is enabled. When the standby loop 260 is enabled, the control logic 230 sets the output EN signal 232 to equal the standby level detector 210 output, EN_STB signal 212. The corresponding EN 232 signal then controls the charge pump circuit 240 such that the charge pump circuit 240 output voltage signal, VH signal 242, biases the operation of the assist driver circuit 250 to avoid producing overshoots in the output (VBL 252) of the voltage assist circuit 110. For example, when the standby loop 260 is enabled, the standby level detector 210 regulates the gate voltage of the assist driver circuit 250 (the VH signal 242) such that the VH signal 242 is less than the target level (VBL 252+ $V_{threshold,N}$), which turns off the assist driver circuit 250 in order to avoid an overshoot voltage level at the output of the voltage assist circuit 110, VBL voltage 252.

Similarly, in some examples, when the voltage generator assist system 100 is in an active state, the active loop 270 is enabled. When the active loop 270 is enabled, the control logic 230 sets the output EN signal 232 to equal the active level detector 220 output, EN_ACT signal 222. The corresponding EN 232 signal then controls the charge pump circuit 240 such that the charge pump circuit 240 output voltage signal, VH signal 242, biases the operation of the assist driver circuit 250 to immediately inject current in the output of the voltage driver assist system 100. For example, when the active loop 270 is enabled, the active level detector 220 detects large driving requirements in the output (VBL 252) of the voltage assist circuit 110 and boosts the gate voltage (VH signal 242) of the assist driver circuit 250 to be higher than the target level (VBL 252+$V_{threshold,N}$) in order to inject current immediately in the output (VBL 252) of the voltage assist circuit 110.

The implementation of the standby level detector 210, the active level detector 220, the control logic 230 and the assist driver circuit 250 are described in further detail in FIGS. 3-6. The charge pump circuit 240 can be any type of charge pump circuit and can be implemented using any known charge pump configuration. The charge pump circuit 240 is used to generate the control bias voltage, VH signal 242 that connects to the gate voltage of the assist driver circuit 250 and biases the operation of the assist driver circuit 250.

Figure 3:
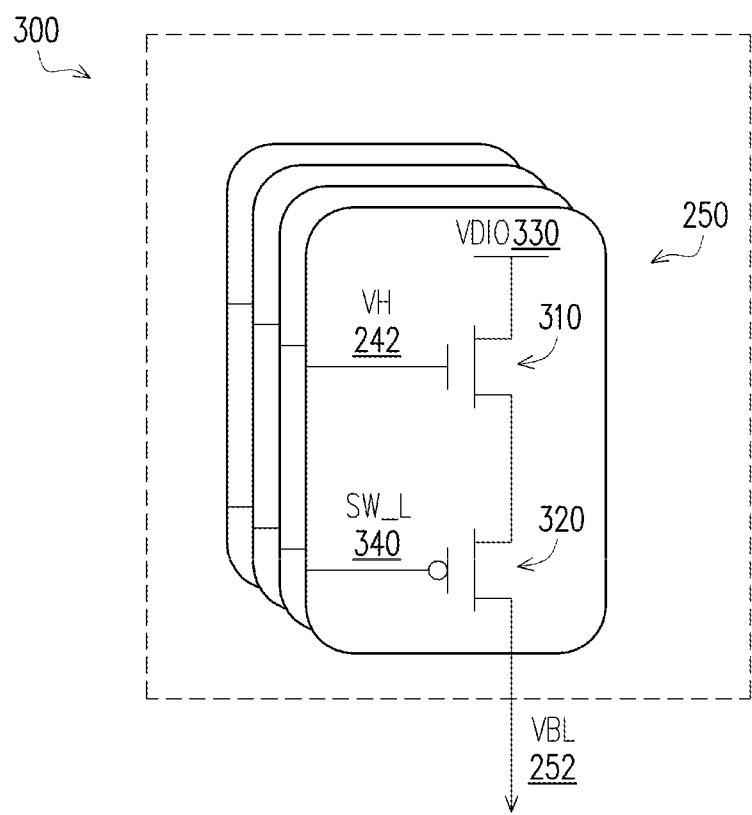
FIG. 3 illustrates an example implementation of the assist driver circuit in accordance with some embodiments.

FIG. 3 illustrates an example implementation 300 of the assist driver circuit 250. In some examples, the assist driver circuit includes one or more distributed assist NMOS drivers. In some examples, the number of distributed assist NMOS drivers is correlated to the amount of drive current that is required by the load beyond the capability of the power supply generator and the drive strength of each assist NMOS driver. In some examples, the number of distributed assist NMOS drivers depends on number of the IO in load memory cell(s). For example, depending on the drive strength of each assist NMOS driver, there may be one assist NMOS drivers in the one or more distributed assist NMOS drivers for each IO. Other configurations are also possible.

In the disclosed example, where the assist driver circuit 250 is implemented as one or more distributed assist NMOS drivers, each of the one or more distributed assist drivers 250 includes a gate driver circuit with an NMOS transistor 310 connected to a PMOS transistor 320. For example, the drain terminal of the NMOS transistor 310 is connected to a power supply VDIO 330 that is different than the power supply of the power supply generator 120. The gate terminal of the NMOS transistor 310 is connected to the output of the charge pump circuit 240, the VH signal 242. The source terminal of the NMOS transistor 310 is connected to the source terminal of the PMOS transistor 320. The drain terminal of the PMOS transistor is the output of voltage assist circuit 110, VBL 252. The gate terminal of the PMOS is connected to a switch signal SW_L 340. Each SW_L signal 340 may be associated with an I/O address signal. In some examples, each I/O of the load is associated with one of the one or more distributed assist NMOS drivers and selecting an I/O address selects the associated SW_L signal, which turns on the associated PMOS transistor, and thus the associated NMOS driver. In some examples, an address decoder and/or a level shifter may be used in associating an I/O address to a SW_L signal and biasing the signal appropriately. Other implementations are possible.

In some examples, when the load 130 does not receive sufficient power, voltage assist circuit 110 is needed to supplement the power supplied by the power supply generator 120. In some examples, when the VH signal 242 is greater than or equal to the target level (sum of the VBL signal 252 and the threshold voltage of the NMOS transistor 310 (VH≥VBL+$V_{threshold,N}$)), the NMOS transistor 310 turns on and the logic controlling the SW_L signal turns on the PMOS transistor 320 in order for an immediate charge injection from VDIO 330 to VBL 252. In some examples, when the VH signal 242 is less than the target level (VH<VBL+V$_{threshold,N}$), the NMOS turns off and the logic controlling the SW_L signal turns off such that there is no charge injection from the VDIO 330 to the VBL 252.

Figure 4:
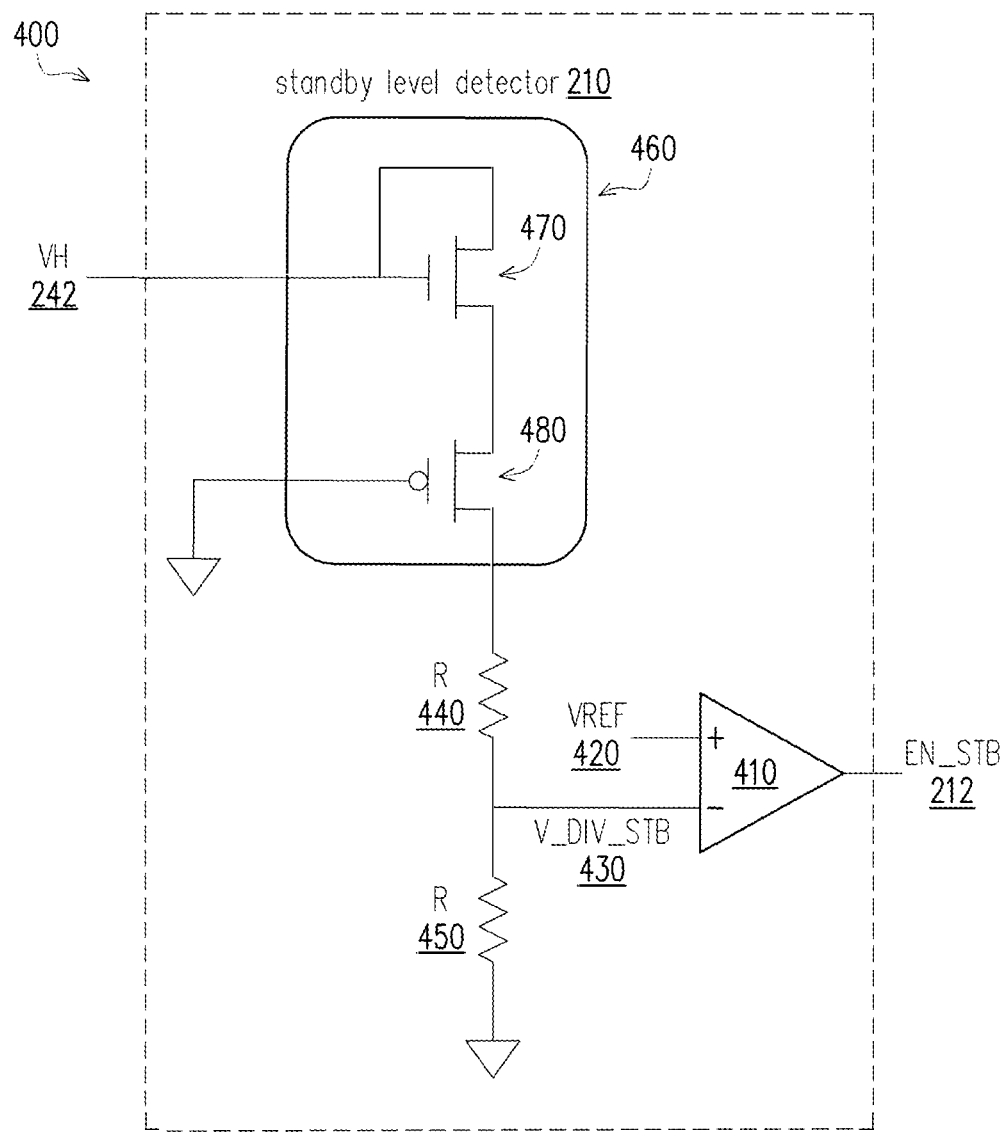
FIG. 4 illustrates an example implementation of the standby level detector in accordance with some embodiments.

FIG. 4 illustrates an example implementation 400 of the standby level detector 210. In one example, the standby level detector 210 includes a comparator circuit 410 to set the detector output signal EN_STB 212 to high or low. The comparator circuit 410 may compare the two input voltages VREF 420 and V_DIV_STB 430 and provide the output of the standby level detector, the EN_STB voltage 212. In some examples, the VREF voltage 420 may include a reference voltage that may be set to one half of the VBL 252 voltage. In some examples, the V_DIV_STB voltage 430 may be configured to measure a fraction of what the output voltage VBL 252 of the assist driver circuit 250.

In some examples, in order to compare VH 242 voltage to the target level (VBL 252+V$_{threshold,N}$), a NMOS driver circuit 460 that matches the disclosed assist driver circuit 300, including a NMOS transistor 470 and a PMOS transistor 480 can be implemented as part of the standby level detector configuration in order to simulate the effects of the assist driver circuit 250.

The drain terminal and the gate terminal of the NMOS transistor 470 are tied together and connected to the output of the charge pump, VH 242. The source terminal of the NMOS transistor 470 is connected to the source terminal of the PMOS transistor 480. The drain terminal of the PMOS transistor 480 represents the output voltage of the assist driver circuit 250 and may be connected to the voltage divider circuit. The gate terminal of the PMOS 480 is tied to a ground terminal, thereby biasing the PMOS transistor 480 to be turned on.

In some examples, the voltage divider circuit, such as a resistor voltage divider, can be used to measure the fraction of what the output voltage of the charge pump, VH 242 may be. In the disclosed example, a resistor voltage divider circuit with two resistors 440, 450 that are equal in value is used. The VREF 420 value is thus set to one half of VBL 252. Other resistor values are possible. In such cases, the associated VREF is adjusted accordingly. In the disclosed configuration the V_DIV_STB 430 is equal to (VH−V$_{threshold,N}$)/2. Other configurations and V_DIV_STB 430 values are also possible.

In some examples, the comparator 410 is configured to compare the VREF 420 and the V_DIV_STB 430. When the V_DIV_STB 430 value is less than VREF 420, the EN_STB 212 is pulled high and the VH is at a write standby state and the assist driver circuit 250 is turned off. When the V_DIV_STB 430 is greater than or equal to the VREF 420, the EN_STB 212 is pulled low. In some examples, EN_STB 212 may be fed into control logic 230, which in turn controls the operation of the charge pump circuit 240. The control logic 230 is described in further detail in relation to FIG. 6.

Figure 5:
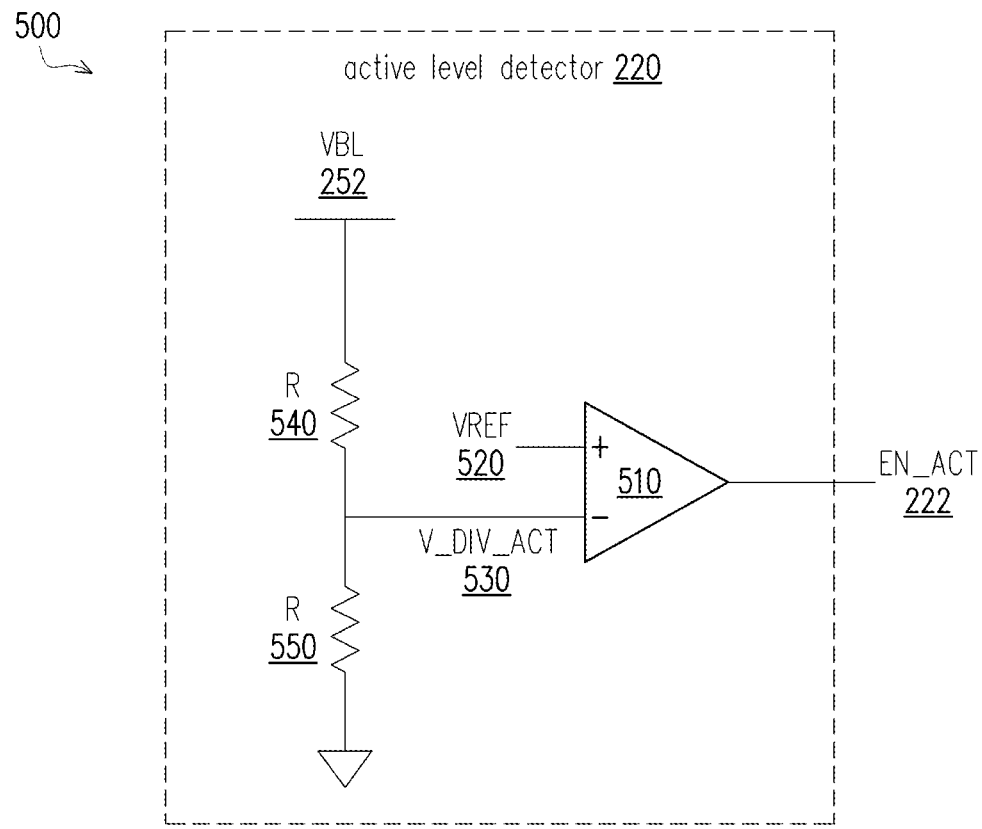
FIG. 5 illustrates an example implementation of the active level detector in accordance with some embodiments.

FIG. 5 illustrates an example implementation 500 of the active level detector 220. In one example, the active level detector 220 includes a comparator circuit 510 to set the value of the detector output signal EN_ACT 222 to high or low. The comparator circuit 510 may compare the two input voltages VREF 520 and V_DIV_ACT 530 and provide the output of the active level detector, the EN_ACT voltage 222. In some examples, the VREF voltage 520 may include a reference voltage that may be set to one half of the VBL 252 voltage. In some examples, the V_DIV_ACT 530 is connected to the output of the assist driver circuit 250 through a voltage divider circuit, which helps measure a fraction of the output voltage of the assist driver circuit 250.

In some examples, a voltage divider circuit, such as a resistor voltage divider, can be used to measure the fraction of what the output voltage of the assist NMOS driver. In the disclosed example, a resistor voltage divider circuit with two resistors 540, 550 that are equal in value is used. Other resistor values are possible. In the disclosed case, when the resistors 540, 550 are equal in value, the resistor voltage divider divides the VBL voltage, which is connected to the resistor voltage divider, in half. Thus, the V_DIV_ACT 530 that is VBL/2. The VREF 520 value in this case is set to one half of VBL 252. The V_DIV_ACT 530 value thus changes based on the configuration and component value of the voltage divider circuit.

In some examples, the comparator 510 is configured to compare the VREF 520 and the V_DIV_ACT 530. When the V_DIV_ACT 530 value is less than or equal to VREF 520, the EN_ACT 222 is pulled high. Under such conditions, the VH is in an active state and the assist driver circuit 250 is turned on. When the V_DIV_ACT 530 is greater than the VREF 520, the EN_ACT 222 is pulled low. In some examples, EN_ACT 222 may be fed into control logic 230, which in turn controls the operation of the charge pump circuit 240. The control logic 230 is described in further detail in relation to FIG. 6.

Figure 6:
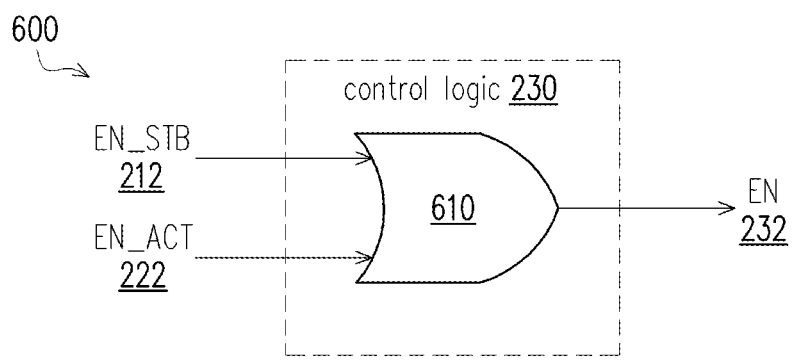
FIG. 6 illustrates an example implementation of the control logic in accordance with some embodiments.

FIG. 6 illustrates an example implementation 600 of the control logic 230. In one example, the control logic 230 includes an OR logic gate 610. The OR logic gate 610 can take EN_STB 212 and EN_ACT 222 as inputs and produce the enable signal EN 232 as an output. The EN signal 232 controls the operation of the charge pump circuit 240. The charge pump circuit 240 can be implemented using any charge pump configuration. For example, the EN signal 232 is high when the EN_STB 212 or the EN_ACT 222 signal is high and low only when both EN_STB 212 and EN_ACT 222 are both low.

For example, during a write standby state, the EN signal 232 is set to EN_STB 212 and the resulting output voltage of the charge pump, VH 242, which is connected to the gate terminal of the NMOS transistor of the disclosed implementation of the assist driver circuit 250, is set to a target level that is less than VBL+V$_{TH,N}$. Thus, the assist driver circuit 250 is disabled and there is no injection current that flows from the assist NMOS driver power supply VDIO 330 to voltage assist circuit output, VBL 252. Additionally, in some examples, the EN_STB 212 signal goes high for a short burst when the VH 242 value drops below a reference value, VREF 420, during a write standby state. This is to ensure that the assist NMOS driver bias voltage does not drop too low, thus allowing for the assist driver circuit 250 to turn on quickly when a subsequent write operation occurs.

For example, during the active write state, the EN signal 232 is set to EN_ACT 222 and the resulting output of the charge pump, VH 242, which is connected to the gate terminal of the NMOS transistor of the disclosed implementation of the assist driver circuit 250, is set to a target level that is greater than or equal to VBL+V$_{TH,N}$. Thus, the assist driver circuit 250 is enabled and there is an injection current that flows from the assist driver circuit power supply, VDIO 330, to assist the power supply generator 120. In some examples, using the double regulation loop structure for the voltage assist circuit 110 helps improve settling time and droop without significant voltage overshoots during load write operations.

Figure 7:
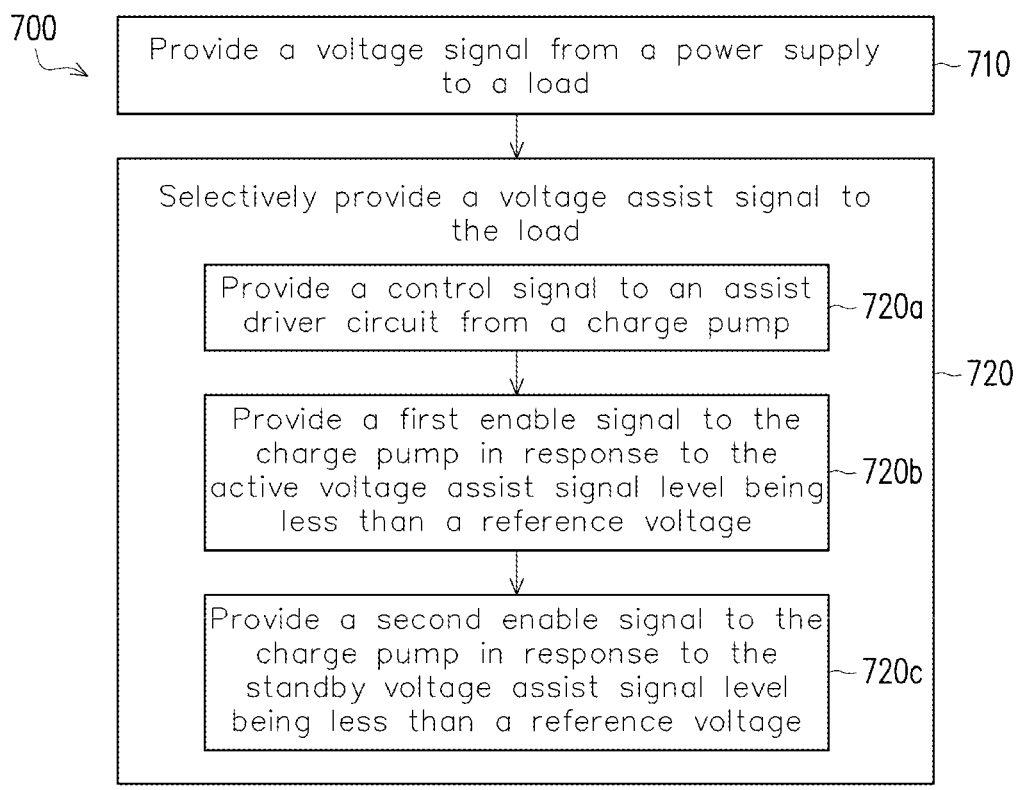
FIG. 7 is a flow diagram illustrating an example of a method in accordance with some embodiments.

FIG. 7 is a flow diagram 700 illustrating an example of a method in accordance with some embodiments. At step 710, a power supply 120 is used to provide a voltage signal to a load 130. At step 720, depending on the demand for power from the load 130 and the power supply's 120 ability to meet that demand, a voltage assist circuit 110 is used to selectively provide a voltage assist signal to the load 130. Step 720 includes performing sub-steps 720a-720c. At sub-step 720a, a control signal is provided to the assist driver circuit 250 from the charge pump 240, wherein the assist driver circuit 250 is configured to output the voltage assist signal. At step 720b, the active level detector 220 and control logic 230 provide a first enable signal to the charge pump 240 in response to the active voltage assist signal level being less than a reference voltage, in order to regulate the control signal at a first level to turn on the assist driver circuit 250 and inject a current to the load 130. At step 720c, the standby level detector 210 and control logic 230 provide a second enable signal to the charge pump 240 in response to the standby voltage assist signal level being less than a reference voltage, in order to regulate the control signal at a second level to maintain the control signal at a predetermined voltage level.

Figure 8:
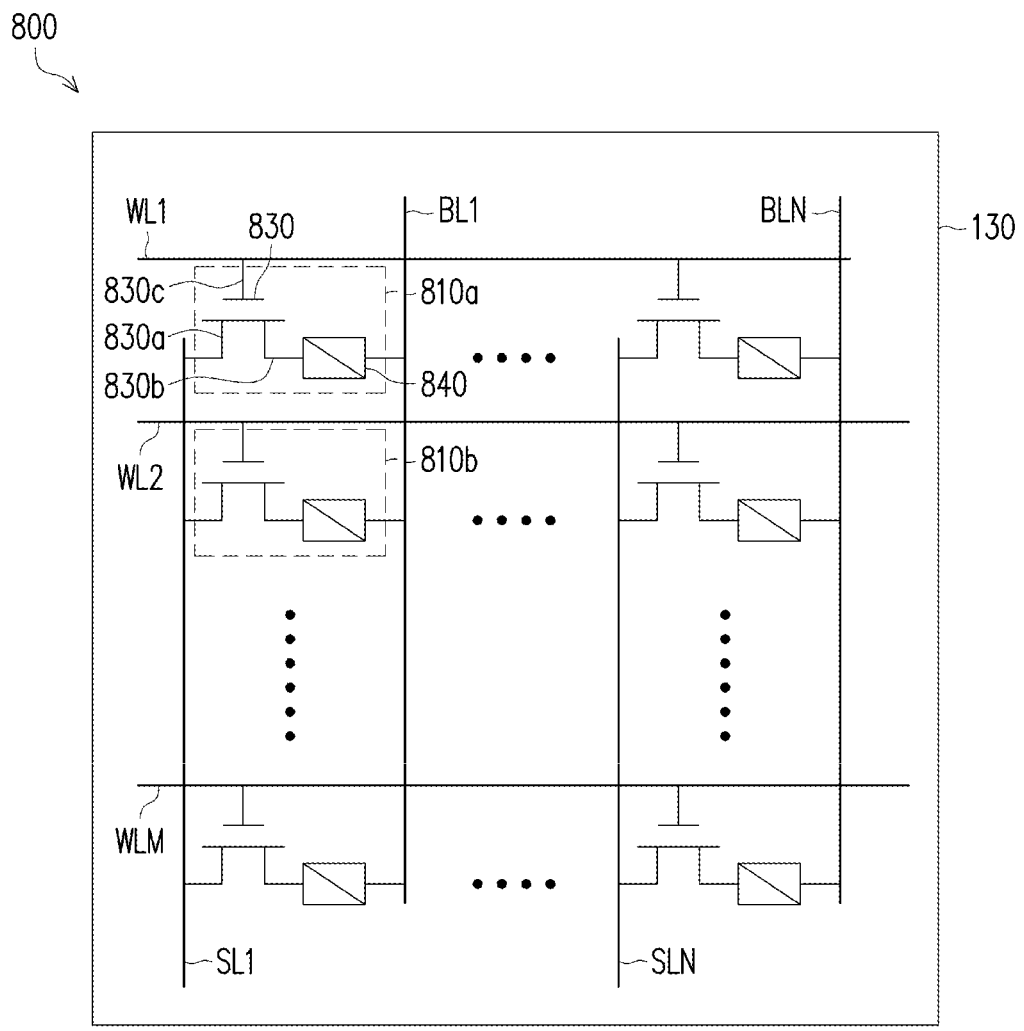
FIG. 8 is a circuit diagram illustrating an example MRAM memory array in accordance with some embodiments.

FIG. 8 is a circuit diagram 800 illustrating an example of the load 130, where the load is a MRAM memory array in accordance with some embodiments. In the example shown, the array 130 includes a plurality of the bit cells arranged in an array of rows and columns. For clarity of illustration, only two of the bit cells are labeled in FIG. 8, i.e., one of the bit cells in the first row labeled as 810a and one of the bit cells in the second row labeled as 810b. The bit cells may collectively be referred to as bit cells 810.

As illustrated in FIG. 8, the memory array 130 further includes a plurality of word lines (WL1, WL2, WLM, etc.), bit lines (BL1, BLN, etc.), and source lines (SL1, SLN, etc.). The word line WL1 connects the bit cells 810 in the first row, the word line WL2 connects the bit cells 810 in the second row, and the word line WLN connects the bit cells 810 in the Nth row. The bit line BL1 and the source line SL1 connect the bit cells 810a, 810b, etc., in the first column, and the bit line BLN and the source line SLN connect the bit cells 810 in the second column. Therefore, in the example shown, the bit cell unit 810 includes M rows, N columns, and M×N bit cells 810. The bit lines BL1, BLN, etc., can be selectively connected to a sense amplifier 100 via switches (not shown) depending on exactly which bit cell in the array is to be read to or written from.

Because the bit cells 810 are the same in construction and operation, only one, i.e., the bit cell 810a, will be described here. In this embodiment, the bit cell 810a includes a transistor 830 and a resistive element 840. The transistor 830 can be a field-effect transistor (FET), e.g., a metal-oxide semiconductor FET (MOSFET), and includes a first source/drain terminal 830a connected to the source line SL1, a second source/drain terminal 830b, and a gate terminal 830c connected to the word line WL1. In an alternative embodiment, the memory device 100 does not include the source line SL. In such an alternative embodiment, the first source/drain terminal 830a of the transistor 830 is connected to a ground or other node of the memory device 10. The transistor 830 may be any type of transistor, including, e.g., a junction-type transistor, such as a bipolar junction transistor (BJT).

The resistive element 840 is connected between the second source/drain terminal 830b of the transistor 830 and the bit line BL1. In some embodiments, the resistive element 840 is an MTJ. The resistive element 840 may be any type of resistive element or circuit so long as it achieves the intended function described herein.

In an exemplary write operation, write voltages are applied to the bit line BL1, the source line SL1, and the word line WL1. A voltage applied to the word line WL1 activates the transistor 830 and a write current flows through the bit cell 810a. That write current flows through the MTJ 840, causing the MTJ 840 to switch from a parallel state to an anti-parallel state or vice versa, whereby a bit of data is written and stored in the bit cell 810a. When it is desired to switch the MTJ 840 from the anti-parallel state to the parallel state to store a "0" value, a switch current is passed through the MTJ 840 from the free layer to the reference layer. Conversely, when it is desired to switch the MTJ 840 from the parallel state to the anti-parallel state to store a "1" value, a switch current is passed through the MTJ 840 from the reference layer to the free layer.

When the free layer of the MTJ 840 is in the parallel state, the MTJ 840 exhibits a low resistance that represents a logic "0" value and the MTJ 840 is said to be in a parallel state or a low resistance state. Conversely, when the free layer is in the anti-parallel state, the MTJ 840 exhibits a high resistance that represents a logic "1" value and the MTJ 840 is said to be in an anti-parallel state or a high resistance state. In some embodiments, the logic represented by the MTJ 840 in a high or low resistance state is arbitrary, e.g. the logic "1" can be represented by the MTJ 840 in a low resistance state and the logic "0" can be represented by the MTJ 840 in a high resistance, and is determined by the desired convention used for the memory device. Whichever convention is chosen, the MTJ 840 can store binary data via two writeable and readable states, e.g. the high resistance and low resistance states. For purposes of consistency, embodiments described herein will use the convention that the MTJ 840 in the low resistance state represents a "0" and the MTJ 840 in the high resistance state represents a "1," unless otherwise stated.

Thus, disclosed embodiments provide a voltage assist system that selectively assists a power supply generator in providing power to a load. In examples where the load is a memory array, such as a MRAM array, the disclosed voltage assist system improves the settling time and decreases droop during write operations of the MRAM without significant voltage overshoots during write operation stop.

In accordance with some embodiments, a system that assists in supplying power to a load is disclosed. The system includes a voltage assist circuit configured to selectively supply an assist voltage signal to a power supply generator in response to a load. The voltage assist circuit has a charge pump, a driver circuit receiving a control signal from the charge pump, a first control circuit configured to control the voltage assist circuit in response to the control signal from the charge pump, and a second control circuit configured to control the voltage assist circuit in response to the assist voltage signal.

In according with further embodiments, a method for selectively assisting a power supply in supplying power to a load is disclosed. The method includes providing a voltage signal from a power supply to a load. The method also includes selectively providing a voltage assist signal to inject a current into the load. The method of selectively providing a voltage assist signal includes the steps of: outputting a control signal to an assist driver circuit from a charge pump, wherein the assist driver circuit is configured to output the voltage assist signal; outputting a first enable signal to the charge pump in response to the first voltage assist signal level being less than a reference voltage, to regulate the control signal at a first level to turn on the assist driver circuit and inject the current to the load; and outputting a second enable signal to the charge pump in response to the second control signal level being less than the reference voltage, to regulate the control signal at a second level to maintain the control signal at a predetermined voltage level.

In accordance with further embodiments, a system to selectively assist a power supply generator in supplying power to a load is disclosed. The system includes one or more memory cells, a power supply generator circuit, wherein the power supply generator circuit produces a bit line voltage for the one or more memory cells, an voltage assist circuit, connected to an output of the power supply generator circuit, wherein the voltage assist circuit assists the power supply generator circuit in meeting the current demand of the one or more memory cells when the one or more memory cells is performing a write operation, and wherein the voltage assist circuit includes: one or more NMOS driver circuits configured to inject a drive current to an output of the voltage assist circuit when enabled, a charge pump circuit connected to the input of the one or more NMOS driver circuits and configured to bias the gate voltage of the one or more NMOS driver circuits, an active level detector circuit connected to the output of the one or more driver circuits and configured to detect the bit line voltage, a standby level detector circuit connected to an input of the one or more driver circuits, a control logic circuit, wherein the outputs of the active level detector circuit and the standby level detector circuit are connected to the inputs of the control logic circuit and the output of the control logic circuit is connected to the input of the charge pump circuit, wherein, upon detecting that the one or more memory cells are performing the write operation and in need of a current injection, the active level detector circuit produces an output enable signal that controls the operation of the charge pump circuit in order to boost the output of the charge pump circuit to a target level, wherein, upon detecting that the one or more memory cells is in the standby mode, the standby level detector circuit produces another output enable signal that regulates the operation of the charge pump circuit such that the output gate bias voltage remains at the target level during the standby mode, and wherein the target level is the sum of a bit line voltage of the one or more memory cells and the threshold voltage of the NMOS transistor.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage assist circuit configured to selectively supply an assist voltage signal to a power supply generator in response to a load, the voltage assist circuit comprising:
   a charge pump;
   a driver circuit receiving a control signal from the charge pump, wherein the driver circuit includes one or more distributed NMOS driver circuits, each of the one or more distributed NMOS driver circuits including an NMOS transistor that is connected to a PMOS transistor;
   a first control circuit configured to control the voltage assist circuit in response to the control signal from the charge pump;
   a second control circuit configured to control the voltage assist circuit in response to the assist voltage signal supplied by the driver circuit in response to demands of the load; and
   a control logic circuit, wherein the control logic circuit is connected to an output of the first control circuit and an output of the second control circuit.

2. The voltage assist circuit of claim 1, wherein, upon detecting that a supply of the assist voltage signal is needed to assist the power supply generator in response to the load, the second control circuit is configured to enable the driver circuit to inject a drive current.

3. The voltage assist circuit of claim 1, wherein the load includes one or more memory cells.

4. The voltage assist circuit of claim 3, wherein the one or more memory cells are Magnetoresistive Random Access Memory (MRAM) cells.

5. The voltage assist circuit of claim 4, wherein the assist voltage signal is connected to a bit line voltage of the one or more MRAM cells.

6. The voltage assist circuit of claim 1, wherein:
   a drain terminal of the NMOS transistor is connected to a second power supply;
   a gate terminal of the NMOS transistor is connected to the control signal;
   a source terminal of the NMOS transistor is connected to the source terminal of the PMOS transistor;
   a gate terminal of the PMOS transistor is connected to a bias voltage; and
   a drain terminal of the PMOS transistor is connected to the power supply generator.

7. The voltage assist circuit of claim 6, wherein the enabling the one or more driver circuits includes boosting the gate voltage of the NMOS transistor to be greater than or equal to a target level, wherein the target level is the sum of the assist voltage signal and the threshold voltage of the NMOS transistor.

8. The voltage assist circuit of claim 6, wherein disabling the one or more driver circuits includes regulating the gate voltage of the NMOS transistor to be less than the target level, wherein the target level is the sum of the assist voltage signal and the threshold voltage of the NMOS transistor.

9. The voltage assist circuit of claim 1, wherein the second control circuit includes a voltage divider circuit connected to the assist voltage signal and a comparator circuit connected to the output of the voltage divider circuit and configured to compare a fraction of the assist voltage signal to a reference voltage to determine whether the driver circuit should be enabled.

10. The voltage assist circuit of claim 1, wherein the first control circuit includes:
   a replica driver circuit that matches the driver circuit;
      wherein a drain terminal of a NMOS transistor of the replica driver circuit and a gate terminal of the NMOS transistor of the replica driver circuit are tied to the output of the charge pump, a source terminal of the NMOS transistor of the replica driver circuit is connected to a source terminal of a PMOS transistor and a gate terminal of the PMOS transistor of the replica driver circuit is tied to ground; and
      wherein replica driver circuit is configured to mimic the operation of the driver circuit in order to accurately determine a bias gate voltage needed to disable the driver circuit;

a voltage divider circuit connected to a drain terminal of the PMOS transistor of the replica driver circuit; and a comparator circuit connected to the output of the voltage divider circuit and configured to compare a fraction of the bias gate voltage of the one or more driver circuits to a reference voltage to determine whether the driver circuit should be disabled.

11. The voltage assist circuit of claim 1, further comprising a switch to control the operation of the voltage assist circuit, wherein the voltage assist circuit is turned on by turning on the switch and turned off by turning off the switch.

12. A method of selectively providing a voltage assist signal to a power supply generator in response to a load, the method comprising:

outputting a control signal to an assist driver circuit from a charge pump, wherein the assist driver circuit includes one or more distributed NMOS driver circuits, each of the one or more distributed NMOS driver circuits including an NMOS transistor that is connected to a PMOS transistor;

outputting a first enable signal to the charge pump in response to a first voltage assist signal level being less than a reference voltage, to regulate the control signal at a first level to turn on the assist driver circuit and inject a current to the load; and outputting a second enable signal to the charge pump in response to a second control signal level being less than the reference voltage, to regulate the control signal at a second level to maintain the control signal at a predetermined voltage level.

13. The method of claim 12, wherein:

a drain terminal of the NMOS transistor is connected to a power supply;

a gate terminal of the NMOS transistor is connected to an output of a charge pump circuit;

a source terminal of the NMOS transistor is connected to the source terminal of the PMOS transistor;

a gate terminal of the PMOS transistor is connected to a bias voltage; and a drain terminal of the PMOS transistor is connected to an output of the power supply generator circuit.

14. The method of claim 13, wherein the turning on of the assist driver circuit includes boosting a gate voltage level at the gate terminal of the NMOS transistor to be greater than or equal to a target level, wherein the target level is a sum of the voltage assist signal and the threshold voltage of the NMOS transistor.

15. The method of claim 13, wherein maintaining the control signal includes controlling the operation of the assist driver circuit, including:

detecting the voltage level of the control signal;

upon determining that the voltage level of the control signal is higher than the predetermined level, turning the assist driver circuit on; and upon determining that the voltage level of the control signal is lower than the predetermined level, turning the assist driver circuit off.

16. The method of claim 15, wherein turning the assist driver circuit off includes regulating a gate voltage level at the gate terminal of the NMOS transistor to be less than a target level, wherein the target level is a sum of the voltage assist signal and the threshold voltage of the NMOS transistor.

17. A voltage assist circuit to selectively supply an assist voltage to a power supply generator in order to meet power demands of a memory cell, the voltage assist circuit comprising:

a driver circuit configured to inject a drive current to an output of the voltage assist circuit when enabled, wherein the driver circuit includes one or more distributed NMOS driver circuits, each of the one or more distributed NMOS driver circuits including an NMOS transistor that is connected to a PMOS transistor;

a charge pump circuit connected to an input of the driver circuit and configured to control an operation of the driver circuit;

an active level detector circuit connected to an output of the driver circuit and configured to detect a bit line voltage of the memory cell;

a standby level detector circuit connected to the input of the driver circuit; and a control logic circuit, wherein outputs of the active level detector circuit and the standby level detector circuit are connected to inputs of the control logic circuit and an output of the control logic circuit is connected to an input of the charge pump circuit.

18. The voltage assist circuit of claim 17, wherein, upon detecting that the memory cell is performing a write operation and in need of a current injection, the active level detector circuit is configured to produce a first output enable signal that controls an operation of the charge pump circuit in order to boost an output of the charge pump circuit to a target level.

19. The voltage assist circuit of claim 17, wherein, upon detecting that the memory cell is in a standby mode, the standby level detector circuit is configured to produce a second output enable signal that regulates an operation of the charge pump circuit such that an output of the charge pump circuit remains at a target level during the standby mode.

20. The voltage assist circuit of claim 17, wherein the memory cell is a Magnetoresistive Random Access Memory (MRAM) cell.

* * * * *